United States Patent [19]
Wolf et al.

[11] Patent Number: 4,699,208
[45] Date of Patent: Oct. 13, 1987

[54] COOLING APPARATUS FOR AN ELECTRICAL CABINET OF A TEXTILE MACHINE

[75] Inventors: Horst Wolf, Albershausen; Karl Blösl, Süssen, both of Fed. Rep. of Germany

[73] Assignee: Zinser Textilmaschinen GmbH, Ebersbach, Fed. Rep. of Germany

[21] Appl. No.: 861,533

[22] Filed: May 9, 1986

[30] Foreign Application Priority Data

May 11, 1985 [DE] Fed. Rep. of Germany ....... 3517149

[51] Int. Cl.[4] ............................................. H01L 23/46
[52] U.S. Cl. ..................................... 165/47; 165/123; 165/185; 165/122; 165/80.3; 361/384
[58] Field of Search ................ 165/123, 122, 47, 80.3; 361/383, 384

[56] References Cited

FOREIGN PATENT DOCUMENTS 39854 3/1985 Japan ................................... 361/383

OTHER PUBLICATIONS

Lee et al, SW *Tipped Modules to Enhance Cooling*, IBM Technical Disclosure Bulletin, vol. 21, No. 12, 5/1979, pp. 4791, 4792.

*Primary Examiner*—Albert W. Davis, Jr.
*Attorney, Agent, or Firm*—Karl F. Ross; Herbert Dubno

[57] ABSTRACT

The cooling apparatus for removal of heat from at least one compartment, enclosed space or the like containing electronic or electrical components comprises a metallic ribbed body mounted on the outside of or constructed as a part of a peripheral wall of the compartment and a blower mounted outside of the compartment acting to blow cooling air into the cooling air channels of the ribbed body facing it. The longitudinal direction of the cooling air channels of the ribbed body is so inclined to the direction of flow of the cooling air prior to deflection by the ribbed body that fuzz does not collect on the metallic ribbed body to such an extent that the heat transfer would be impaired. Advantageously, the ribbed body is inclined at an angle of from approximately 35° to 55°, preferably from 40° to 50°, with respect to the direction of flow of the cooling air before it is deflected.

16 Claims, 7 Drawing Figures

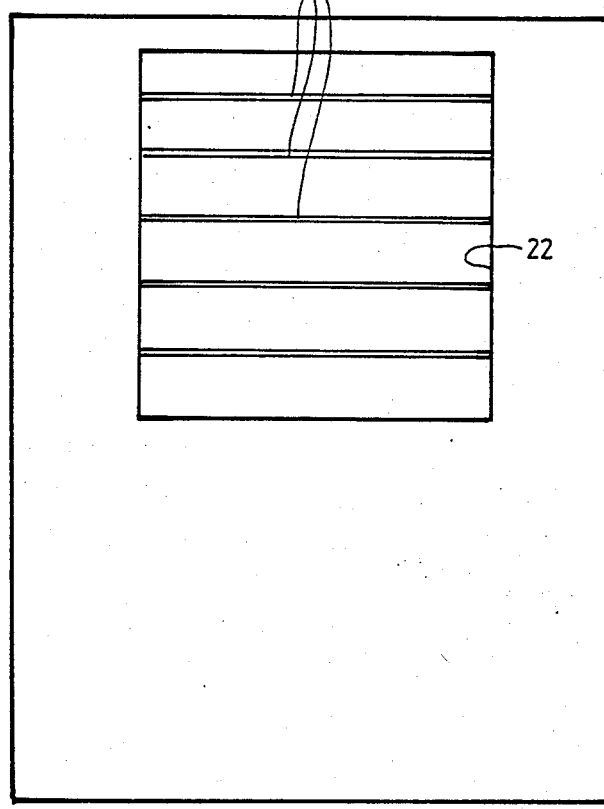
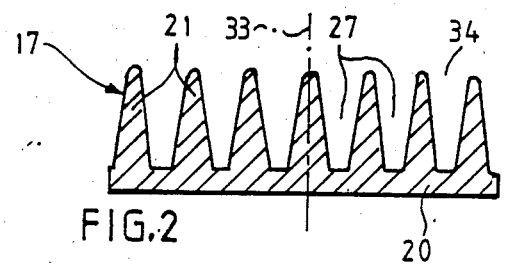
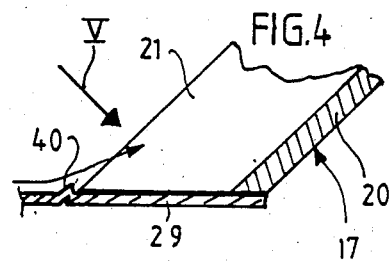
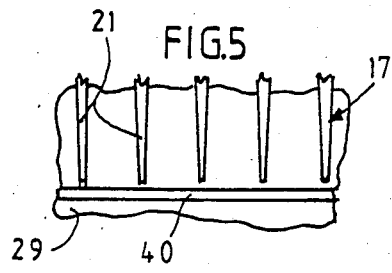
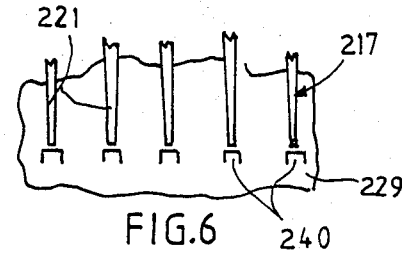

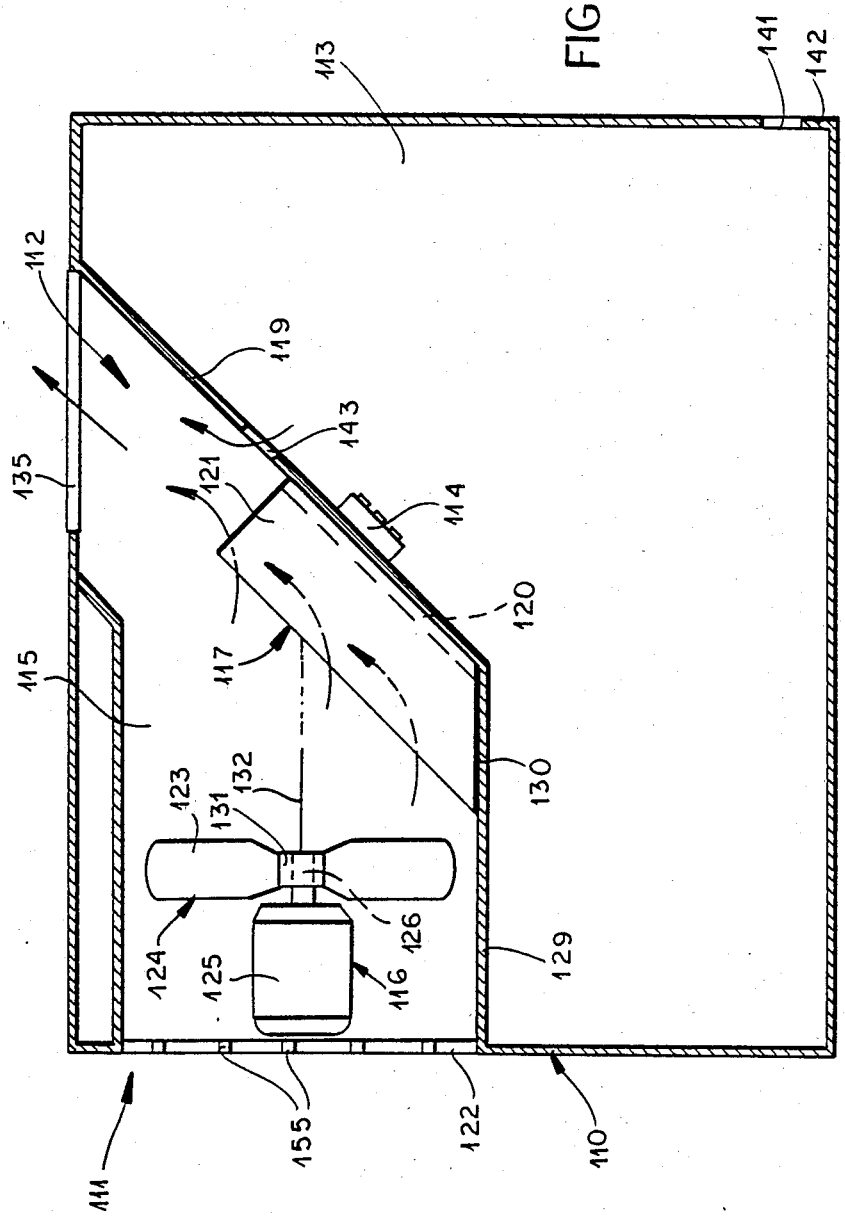

COOLING APPARATUS FOR AN ELECTRICAL CABINET OF A TEXTILE MACHINE

FIELD OF THE INVENTION

Our present invention relates to a cooling apparatus and, more particularly, to a cooling apparatus for removing heat from an interior space, compartment or the like (especially an electrical control cabinet) of a textile machine housing containing at least one heat producing electronic or electrical device.

BACKGROUND OF THE INVENTION

A cooling apparatus is often required in textile machines such as spinning machines to remove heat from an interior space which contains electric and electronic components. For example, the controller for an electric motor drive for the spindles of a ring spinning machine contains components which generate a considerable amount of heat which must be dissipated.

The housing in which the compartment from which heat is to be removed by the cooling apparatus is found, can be the cabinet of an electrical or electronic control panel or other electrical or electronic device, circuit or the like. This removal of heat is particularly necessary when there are circuit components in the compartment which develop considerable heat, for example thyristors, resistors, transformers and the like.

These electronic or electrical circuits or parts of circuits can serve regulatory, controlling or other functions. Thus it may be necessary to remove heat from this compartment with a cooling apparatus so that the temperature does not reach impermissibly or disturbingly high values.

It is known to mount cooling ribs on the housing of such a compartment for cooling of the electronic devices inside of it. On the housing of a control panel or the like, which may be inside a textile machine or at other places in a textile machine room, the cooling ribs can be formed in the peripheral wall of the cabinet and cooling air forced directly on these cooling ribs for cooling.

In the textile machine room often a comparatively large amount of fuzz is formed which comprises fiber pieces, tufts of fiber, fiber bits, dust and other particles which remain floating in the air after being released in the textile manufacturing process.

Textile machines which can have such fuzz in their air include carding and combing machines, drafting frames, flyer frames, spinning machines, looms, twisting machines, winding and spooling machines and the like. Experience with such textile machines with normal cooling ribs used on the housing of electronic devices has shown that an insufficient amount of cooling is obtained when the cooling ribs are subjected to a flow of cooling air, which is directed approximately perpendicular or parallel to their longitudinal direction, since the cooling air which contains fuzz then clogs the cooling ribs.

OBJECTS OF THE INVENTION

It is an object of our invention to provide an improved cooling apparatus for removal of heat from a compartment containing heat producing electronic or electrical components.

It is a further object of our invention to provide an improved cooling apparatus for removal of heat from a compartment containing heat producing electronic components which uses fuzz or dust containing air for cooling.

It is yet another object of our invention to provide an improved cooling apparatus for removal of heat from a compartment containing heat producing electric or electronic devices in a textile machine which uses cooling air which contains a significant amount of fuzz.

SUMMARY OF THE INVENTION

These objects and others, which will become more readily apparent hereinafter are attained in accordance with our invention in a cooling apparatus for removing heat from at least one compartment containing heat producing electric or electronic components, especially in a cooling apparatus for removing heat from a cabinet containing an electric or electronic device or devices used in a textile machine, which uses cooling air containing fuzz or other contaminants from the textile manufacturing process.

According to our invention the cooling apparatus comprises a ventilator or blower mounted outside of the compartment and a metallic ribbed body which forms a section of the wall of the housing of the compartment or is mounted on the outside of the section of the wall of the housing of the compartment with close enough contact to provide good thermal conductivity between the ribbed body and the section of the wall on which it is mounted.

The ribbed body has a plurality of spaced parallel cooling ribs outside of the compartment so that a plurality of cooling air channels are formed between the cooling ribs and those cooling air channels are oriented and positioned to receive a cooling air flow from the ventilator mounted facing the ribbed body. The ribbed body is oriented so that the longitudinal direction of the cooling air channels is so inclined with respect to the direction of flow of the air from the ventilator before deflection by the ribbed body that no fuzz accumulates on the metallic cooling ribs to an extent that removal of heat is impaired.

Surprisingly, it has been found that when the ribbed body with the cooling ribs is appropriately inclined with respect to the cooling air blown at it from the blower, fuzz contained in the cooling air no longer clogs the ribbed cooling body. When, contrastingly, cooling air is blown at this ribbed body approximately perpendicular or approximately parallel to the longitudinal direction of its cooling air channels, it is clogged rather quickly with fuzz and cooling is no longer sufficient.

Advantageously, the flow direction of the cooling air flow to the ribbed body before deflection by it is inclined at an angle of approximately from 35° to 55° to the longitudinal direction of the cooling air channels, even more preferably from 40° to 50°.

The ventilator is preferably an axial ventilator. However, it can be another type of fan or blower, for example a radial blower or a cross-flow blower.

According to a further feature of our invention, the rotation axis of the axial ventilator can approximately strike the longitudinal central plane vertically bisecting the ribbed body and the impeller of the ventilator blows cooling air directly on the ribbed body positioned adjacent the impeller.

Also the front end of the ribbed body upstream with respect to the cooling air flow in the cooling air duct is slanted so that the front end runs approximately parallel to the flow direction of the cooling air before deflection by the ribbed body. An air baffle can be provided adjacent the front end of the ribbed body extending approximately parallel to the flow direction of the cooling air flow to the ribbed body before deflection by the ribbed body. Advantageously, at least one air guiding surface is mounted upstream of the cooling ribs on the air baffle adjacent the cooling ribs, which deflects the cooling air flowing along the air baffle upwardly to the region found over the downstream end of the cooling ribs.

Usually the blower is mounted inside of a cooling air duct.

In one embodiment, at least one air outlet is positioned downstream of the ribbed body in the peripheral wall of the compartment so that the cooling air flowing past the air outlet creates a partial vacuum which pulls in air from the compartment.

Also advantageously, the blades of the impeller of the axial blower are yieldable and elastic composed of a plastic material or rubber and/or the shape of the blades repels fuzz. Usually the cooling ribs of the ribbed body have a smooth surface.

BRIEF DESCRIPTION OF THE DRAWING

The above and other objects, features and advantages of our invention will become more readily apparent from the following specific description, reference being made to the accompanying drawing in which:

FIG. 2 is a cutaway cross sectional view of the cooling ribs of the control panel of FIG. 1 taken along the section line II—II of FIG. 1;

FIG. 3 is a side elevational view of the left side of the control panel of FIG. 1;

FIG. 4 is a longitudinal cross sectional view of a part of the housing of a control panel similar to FIG. 1 but with another embodiment of a cooling apparatus according to our invention;

FIG. 5 is a top plan view of that part of the control panel shown in FIG. 4 as seen in the direction of the arrow V of FIG. 4;

FIG. 6 is a top plan view of a different embodiment of the part shown in FIG. 4 where it is seen that instead of one continuous air guiding surface a separate air guiding surface is provided in front of every individual rib; and FIG. 7 is a side cross sectional view of an alternative embodiment of our invention.

SPECIFIC DESCRIPTION

Figure 1:
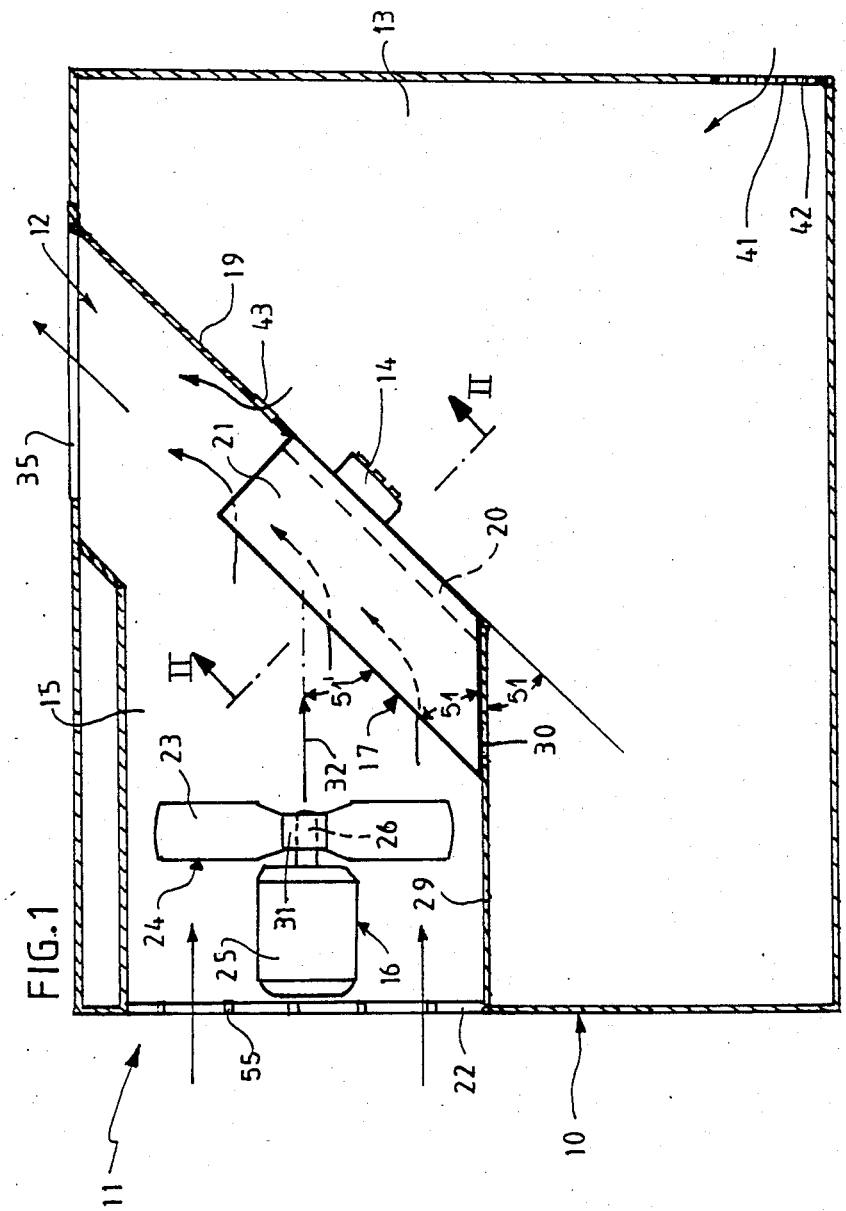
FIG. 1 is a schematic longitudinal cross sectional view through a housing of a control panel showing one embodiment of a cooling apparatus according to our invention.

A housing 10 of a control panel 11 or electrical cabinet is shown having a cooling air duct 15 in which a cooling apparatus 12 is mounted for removing the heat from a compartment 13 of the housing 10. In this compartment 13 of the control panel 11 electronic and electrical components are placed.

Of these components, only a thyristor module 14 is shown which has a plurality of thyristors. These thyristors are at least a part of a rectifier or inverter circuit. For example, all of the essential parts for an electronic controller of a drive motor of a textile machine, particularly a ring spinning machine, can be mounted in this control panel 11. Such a controller develops considerable heat in its operating components which must be removed from the compartment 13 containing these components.

This control panel 11 has a cooling apparatus 12, according to our invention, which permits it to be mounted in a textile machine in which the air contains a considerable amount of fuzz. The fuzz, which arises in the production processes in the textile machine includes fiber pieces, fibers, tufts of fiber, fiber dust and the like which float in the air.

No problem would arise if the cooling apparatus 12 of the control panel 11 could be cooled with fresh air which contains no significant amount of fuzz. However this would increase the cost of cooling considerably more than when the air in the textile machine room which is usually air conditioned is blown in. Thus this cooling apparatus 12 operates with air originating in the machine room as cooling air which also contains much fuzz.

Our cooling apparatus 12 is insensitive to fuzz and no noticeable fuzz accumulation occurs. It has an axial blower 16 acting to draw in cool air and a metallic ribbed body 17. The cover of the compartment 13 of a housing 10 forms a wall 19 oriented at an inclination to the horizontal.

The blower 16 and the smooth cooling ribs 21 of a ribbed body 17 are disposed outside of the compartment 13 in a cooling air duct 15 which has a sufficiently large open cross section. Its air inlet 22 can have a wide mesh protective screen. This protective screen prevents contact between the blower 16 directly behind it and, a hand or other undesirable interfering object although cooling air and any entrained fuzz passes through it.

When the blades 23 of the impeller 24 of this blower 16 comprise soft material such as a synthetic plastic resin or rubber this protective screen can be omitted since it is not then necessary to protect against contact with the rotary impeller 24 or the screen can be replaced or found by several bars 55 as is the case in this embodiment.

The blower 16 has an electric motor 25 on whose horizontally oriented impeller shaft 26 the impeller 24 is mounted.

The plate 20 of the ribbed body 17 can be made in one piece from a good heat conductor such as aluminum and can have a rectangular shape. The plate 20 forms a section of the wall 19 in this embodiment. An alternative embodiment is shown in FIG. 7.

The cooling ribs 21 parallel to each other have an approximately V-shaped profile as seen in FIG. 2. These profiles are substantially equal and the length of a cooling rib 21 is constant. A plurality of cooling air channels 27 are formed between the individual cooling ribs 21. These cooling air channels 27 widen toward the tops of the cooling ribs 21 and are open at the top. These cooling air channels 27 are also open at their downstream ends.

The lower ends of the cooling air channels 27 are closed by a planar horizontal air baffle 29 which forms a horizontal cover section of a peripheral wall 19 of the compartment 13.

This air baffle 29 is slanted as seen from FIG. 1 at an angle 51 to the longitudinal direction of the ribbed body 17 and the cooling air channels 27.

The front side (front end) 30 of the cooling body 17 sits on the air baffle 29 which continues from the cooling body 17 to the left in FIG. 1 until it reaches the air inlet 22 of the cooling air duct 15 and thus is below the left end of the blower motor 25.

The hub 31 of the impeller 24 is spaced from the ribbed body 17 by a distance approximately equal to the diameter of the impeller 24 so that the impeller 24 is positioned comparatively closely to the ribbed body 17.

The cooling air flow generated by the blower 16 flows directly and horizontally to the ribbed body 17 slanted with respect to the direction of flow 32. The direction of air flow 32 from the blower 16 before diverting the cooling air at the ribbed body 17 corresponds to the direction in which the rotation axis of the impeller 24 is oriented and is directed at an angle 51' corresponding to angle 51 to the longitudinal direction of the cooling air channels 27 whose widening openings 34 facing away from the plate 20 face the direct flow of air from the blower 16.

In this example, the angle 51' amounts to about 45° and can be larger or smaller. It is important that the angle of inclination of the ribbed body 17 be such that fuzz does not collect to a disturbing extent on the ribbed body 17. This angle 51' advantageously ranges from approximately 35° to 55°, and especially 40° to 50°.

By directing this flow of cooling air on the ribbed body 17 at these angles, the obstruction of the ribbed body 17 by deposited or accumulated fuzz is surprisingly prevented. When in contrast the flow 32 of this air blast from the blower is directed too steeply or too flatly against the ribbed body, the latter in spite of its comparatively smooth ribs, becomes obstructed relatively quickly with fuzz when the cooling air contains a considerable amount of fuzz.

The rotation axis of the impeller 24 intersects the longitudinal central plane 33 vertically bisecting the plate 20 which runs perpendicularly to the plane of the paper in FIG. 2.

As shown, the impeller 24 is spaced from and above the air baffle 29. The outer periphery of the rotating impeller 24 whose diameter corresponds to the maximum diameter of the impeller 24 has a spacing of about 1/10 this diameter from the air baffle 29. Thus the cooling ribs 21 at the end of the ribbed body 17 bordering the air baffle 29 are not directly blasted by cooling air which is particularly beneficial in cases where fuzz may tend to collect on the lower front ends of the cooling ribs 21 as a result of an inexact fit to the baffle plate 29.

It is thus particularly suitable not to provide the lower ends of the cooling ribs 21 of reduced height, for example of a few millimeters, with a flow of cooling air at higher speed, but instead with other air flow conditions. To provide these lower ends of the cooling ribs 21 with particularly beneficial conditions under which fuzz is not deposited to any significant extent, at least one air guiding surface 40, preferably inclined upwardly, is provided at or spaced from the lower ends of the cooling ribs 21 on the air baffle 29. This air guiding surface 40 deflects the flowing air upwardly to the smooth cooling ribs 21. This air guiding surface 40 in FIG. 5 extends continuously over the entire width of the cooling body 17.

In the embodiment of FIG. 6, by contrast, each of the individual cooling ribs 221 has a separate air guiding surface 240 positioned in front of it in the shape of a nose-like bulge.

The cooling duct 15 can have a rectangular or square cross section. Other cross sectional shapes and changes in cross sectional area over the length of the cooling duct 15 are also possible. In this embodiment the cross sectional area of the cooling duct 15 is reduced in the downstream direction behind the impeller 24 where the horizontal flow region changes to the upwardly directed flow region which ends at the cooling air outlet 35 positioned in the top cover of the control panel 10.

The plate 20 of the cooling body 17 forms in the embodiment according to FIG. 1 a section of the inclined top wall 19 of the compartment 13. A plate 120 can also be mounted on a separate top wall 119 of a compartment 113 as long as there is good thermal conductivity between it and the top wall so that a good heat transfer between the compartment 113 and the cooling body 117 is guaranteed (see the embodiment of FIG. 7).

The flow of cooling air made by the blower 16 can act on the cooling body 17 directly over its entire width. The flow of cooling air whose direction at first runs parallel to the lower horizontal front end 30 of the ribbed body 17 is deflected upwardly through the ribbed body 17, through the air ducts or channels 21 of the ribbed body 17 and then out in the direction of the cooling air outlet 35.

In the embodiment according to FIG. 1, forced air blowing of the compartment 13 by introduction of cooling air is provided whereby the cooling of the compartment 1 is still further enhanced. Adjacent the base of a lateral wall of the compartment 13, in this embodiment, an air inlet 41 with a filter 42 is provided in that side wall. An air outlet 43 is also provided spaced from the inlet 41. The filter 42 is provided so that no significant amount of fuzz or dust reaches the interior of the compartment 13.

The air outlet 43 is positioned slightly downstream from the ribbed body 17, can extend perpendicularly to the plane of FIG. 1 and can comprise a single small slot or a plurality of air outlet openings. The cooling air flows from the blower 16 over this air outlet 43. Air is pulled from the chamber 13 (as a result of the pressure reduction across the outlet 43 caused by the flow of the cooling air) and it joins the cooling air flow in cooling air duct 15.

The ribbed body 17 shown in FIG. 1 can, when a stronger cooling is desired, also be lengthened until it terminates at the cooling air outlet 35 or shortly before it. One can also move the air outlet 43 for the forced blowing of the chamber 13 correspondingly upwardly.

The surface of the cooling ribs 21 can, advantageously, be smooth, but also other surface textures are possible on which, in the shown inclining positions or other inclined positions, no fuzz collects.

An alternative embodiment of our invention is shown in FIG. 7. In this embodiment, the ribbed body 117 is mounted by a base plate or plate 120 attached to a section of wall 119 of the compartment 113 of the housing 110. The ribbed body 117 must have a good contact by its plate 120 with the wall 119 to provide an efficient heat transfer. Otherwise, this embodiment is the same as the embodiment of FIG. 1. Parts which are the same in this embodiment, as in the embodiment of FIG. 1, are numbered with the same number as in FIG. 1 plus 100.

We claim:

1. A cooling apparatus for removing heat from a compartment containing a heat-producing electrical component, said component involved in the control of a textile machine, said apparatus comprising:
a blower mounted outside of said compartment; and
a ribbed metal body along a wall of said compartment and in thermally conductive relation with the interior thereof, said ribbed body having a plurality of transversely spaced cooling ribs outside of said compartment and defining a plurality of cooling air channels, said cooling air channels being oriented and positioned to receive a blast of air from said blower, said air containing fuzz found surrounding said textile machine, said ribbed body being oriented so that a longitudinal dimension of said cooling air channels is inclined with respect to the direction of said cooling air flow from said blower before deflection by said ribbed body and that the flow is then deflected thereby such that no fuzz from said air accumulates on said metallic cooling ribs to such an extent that said removal of said heat is impaired.

2. The cooling apparatus defined in claim 1 wherein the flow direction of said cooling air flow to said ribbed body before said deflection by said ribbed body is inclined at an angle of approximately from 35° to 55° to said longitudinal dimension of said cooling air channels.

3. The cooling apparatus defined in claim 2 wherein said angle is approximately from 40° to 50°.

4. The cooling apparatus defined in claim 3 wherein said blower is an axial-flow blower.

5. The cooling apparatus defined in claim 4 wherein a rotation axis of said axial blower lies in a longitudinal medium plane perpendicularly bisecting said ribbed body and said blower has an impeller which blows cooling air directly on said ribbed body positioned adjacent said impeller.

6. The cooling apparatus defined in claim 5 wherein a front end of said ribbed body upstream with respect to said cooling air flow in a cooling air duct receiving said blower and said body is inclined that said front end runs approximately parallel to said flow direction.

7. The cooling apparatus defined in claim 6 wherein an air baffle is provided adjacent said front end of said ribbed body extending approximately parallel to said flow direction.

8. The cooling apparatus defined in claim 7 wherein at least one air guiding surface is mounted upstream of said cooling ribs on said air baffle adjacent said cooling ribs, which deflects said cooling air flowing along said air baffle upwardly to a region above the downstream end of said cooling ribs.

9. The cooling apparatus defined in claim 1 wherein said blower and body are mounted inside of a cooling air duct.

10. The cooling apparatus defined in claim 9 wherein at least one air outlet is provided in said wall downstream of said ribbed body in said wall of said compartment so that said cooling air flowing past said air outlet in said cooling air duct creates a partial vacuum which pulls in air from said compartment.

11. The cooling apparatus defined in claim 1 wherein the blades of said impeller of said axial blower are flexible.

12. The cooling apparatus defined in claim 1 wherein said cooling ribs of said ribbed body have smooth surfaces.

13. The cooling apparatus defined in claim 1, wherein said wall is continuous and metallic, and said body is mounted on said wall.

14. The cooling apparatus defined in claim 1, wherein said body at least in part forms said wall.

15. The cooling apparatus defined in claim 1, wherein the blades of said impeller are shaped to repel textile fuzz.

16. A cooling apparatus for removing heat from at least one compartment containing an electric or electronic device or devices used in a textile machine which uses cooling air containing fuzz or other contaminants from the textile manufacturing process comprising:

an axial blower mounted in a cooling air duct outside of said compartment;

a metallic ribbed body which forms a section of a wall of a housing of said compartment or is mounted on the outside of said section of said wall of said housing of said compartment in close enough contact to provide good thermal conductivity between said ribbed body and said section of said wall;

a plurality of cooling ribs positioned next to each other parallel outside of said compartment in said ribbed body so that a plurality of cooling air channels are formed between said cooling ribs and said ribbed body is oriented to receive cooling air flowing from said blower and is inclined at an angle of from 40° to 50° with respect to the flow direction of said cooling air from said blower before deflection by said ribbed body;

an air baffle extending approximately parallel to said flow direction of said cooling air prior to deflection by said ribbed body and positioned adjacent the front end of said ribbed body;

at least one air guiding surface mounted upstream of said cooling ribs on said air baffle adjacent said cooling ribs which deflects said cooling air flowing along said air baffle upwardly to the region found over the downstream end of said cooling ribs; and at least one air outlet positioned downstream of said ribbed body in said wall of said compartment so that said cooling air flowing past said air outlet in said cooling air duct creates a vacuum which pulls in air from said compartment.

* * * * *